(12) United States Patent
He et al.

(10) Patent No.: US 10,665,290 B1
(45) Date of Patent: May 26, 2020

(54) MEMORY SECURITY TECHNIQUES USING AUTO REFRESH VALIDATION

(71) Applicant: Micron Technology, Inc., Boise, ID (US)

(72) Inventors: Yuan He, Boise, ID (US); Yutaka Ito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/230,573

(22) Filed: Dec. 21, 2018

(51) Int. Cl.
*G11C 11/4078* (2006.01)
*G11C 11/4091* (2006.01)
*G11C 11/4096* (2006.01)
*G11C 11/4072* (2006.01)

(52) U.S. Cl.
CPC ...... *G11C 11/4078* (2013.01); *G11C 11/4072* (2013.01); *G11C 11/4091* (2013.01); *G11C 11/4096* (2013.01)

(58) Field of Classification Search
CPC .......... G11C 11/401; G11C 11/4072; G11C 11/4078
See application file for complete search history.

(56) References Cited

U.S. PATENT DOCUMENTS

| | | | |
|---|---|---|---|
| 5,423,008 A * | 6/1995 | Young | G06F 13/24 710/107 |
| 8,467,230 B2 | 6/2013 | Behrends et al. | |
| 8,711,606 B2 | 4/2014 | Behrends et al. | |
| 8,726,042 B2 | 5/2014 | Lange et al. | |
| 8,976,572 B2 | 3/2015 | Parris | |
| 9,558,808 B2 | 1/2017 | Parris | |
| 2011/0026339 A1* | 2/2011 | Hayashi | G11C 11/406 365/201 |

OTHER PUBLICATIONS

Neagu et al., Increasing Memory Security through Data Scrambling and Information Entropy Models, IEEE (Year: 2015).*
Jose et al., A Memory Architecture Using Linear and Nonlinear Feedback Shift Register for Data Security, IEEE (Year: 2016).*
Shiner, Jeff; "Micron Addresses IoT Security with New AuthentaTM Technology in Flash Memory," Micron Blogs (Memory Blog), May 31, 2017; available at https://www.micron.com/about/blog/2017/may/micron-addresses-iot-security-with-new-authenta-technology-in-flash-memory.
Halderman et al; "Lest We Remember: Cold Boot Attacks on Encryption Keys;" 17th USENIX Security Symposium; Jul. 2008.
Jose, J., et al., "A memory architecture using linear and nonlinear feedback shift registers for data security," IEEE Int. Conf. Comput. Intell. Comput. Res. (ICCIC), Madurai, 2015, pp. 1-5.
Neagu et al.; "Increasing memory security through data scrambling and information entropy models;" IEEE 15th Int. Symp. Comput. Intell. and Informatics (CINTI), Budapest, 2014, pp. 49-53.

* cited by examiner

*Primary Examiner* — Alfredo Bermudez Lozada
(74) *Attorney, Agent, or Firm* — Fletcher Yoder, P.C.

(57) ABSTRACT

Techniques described herein are related to protecting at least a portion of data stored in a memory array. A method may include detecting an invalid memory access request based at least in part on the secret key and the identifier and preventing unauthorized access of a memory array by halting an internal refresh of one or more memory cells associated with the memory array in response to detecting the invalid memory access request.

18 Claims, 9 Drawing Sheets

MEMORY SECURITY TECHNIQUES USING AUTO REFRESH VALIDATION

BACKGROUND

The present disclosure relates generally to memory devices and, more particularly, to data security techniques for protecting data stored in the memory devices.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In general, a computing system may include an electronic device that, in operation, communicates information via electrical signals. For example, a computing system may include a processor communicatively coupled to a memory device, such as a dynamic random-access memory (DRAM) device employed on a dual in-line memory module (DIMM). In this manner, the processor may communicate with the memory device, for example, to retrieve executable instructions, retrieve data to be processed by the processor, and/or store data output from the processor.

During use, these electrical signals may be accessed, for example, for execution of commands or to facilitate a computer operation. The DRAM device associated with many memory systems may be a security vulnerability, where unpermitted, unauthorized, or malicious users may attempt to access sensitive data stored within the DRAM device. To facilitate improving data security of the DRAM device, reactionary processes may be performed in response to detection of an unauthorized DRAM device access, for example, by a memory controller wiping data stored in the DRAM device (e.g., body biasing during a power ramp), overwriting data stored in the DRAM device (e.g., using word-line coupling techniques, row-copy techniques), or the like. These methods, however, are time-intensive, resource-intensive, and susceptible to internal capacitances of the DRAM device that may continue to store data even after power is removed from the DRAM device. In addition, attempting to erase the data using body biasing techniques may use detection of a power-on state, which may be unstable or generally unrealistic.

BRIEF DESCRIPTION OF THE DRAWINGS

Various aspects of this disclosure may better be understood upon reading the following detailed description and upon reference to the drawings in which.

DETAILED DESCRIPTION

Figure 1:
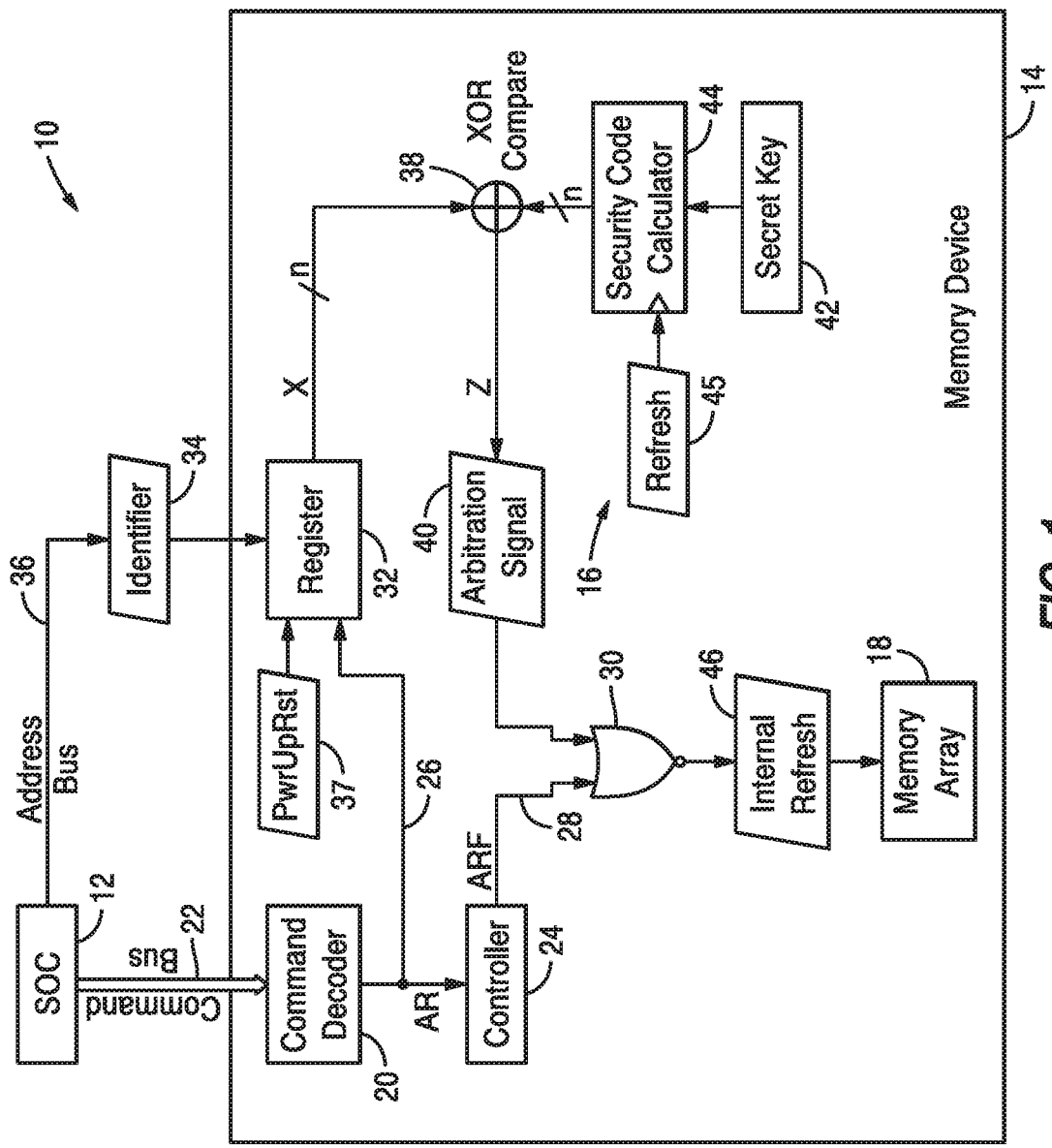
FIG. 1 is a block diagram of a system including a system on a chip (SOC) attempting to access a memory device including validation circuitry, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

A computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

Sometimes unauthorized users or unauthorized programs attempt to access data stored within the memory, such as within a dynamic random-access memory (DRAM) device employed on a dual in-line memory module (DIMM). Since manufacturers of memory devices and/or computing systems have recognized the importance of protecting data stored within memory, some memory devices have been designed to use techniques like wiping data stored in the DRAM device and/or overwriting data stored in the DRAM device in response to unauthorized access attempts. However, as described above, these techniques may be resource intensive and/or time intensive. In addition, these techniques do not address how residual charges stored in capacitors of the DRAM memory may permit the unauthorized access attempt to still access sensitive data persisting within the DRAM memory. Thus, these techniques may not adequately leverage inherent properties of DRAM memory to protect the data stored with the DRAM memory from access by the unauthorized user.

There may be advantages to leveraging one or more inherent properties of the DRAM memory to protect the data stored. The advantages may include faster and/or efficient protection of stored data in response to the unauthorized access compared to techniques described above (e.g., techniques that do not leverage inherent properties). An example of an inherent property of the DRAM memory that may be leveraged is the inherent retention time of the DRAM memory storing the sensitive data. Over time, since the retention time of the DRAM memory is not infinite, electrical signals associated with the sensitive data may have to be refreshed to recharge the electrical signals representing the data stored. Refreshes are performed in response to signaling operations initiating the refresh to be performed. Thus, stopping the refreshes from being performed in response to an unauthorized access attempt may secure sensitive data stored within the DRAM memory in a more effective manner.

To facilitate improving the security of electronic devices, and more particularly the security of DRAM memory associated with electronic devices, the present disclosure provides details for using refresh-based security techniques that, in general, stop, halt, or delay refreshing in response to validation circuitry detecting an unauthorized access attempt. For example, a memory device may refresh normally until an unauthorized access attempt is detected by the validation circuitry. In response to the detection of the unauthorized access attempt by the validation circuitry, internal refresh operations may halt, causing at least some data stored in the DRAM memory to be erased or altered, and thus protecting at least some data of the DRAM device from unauthorized access.

Logic circuitry included on the memory device may receive a refresh control signal from a command decoder and an arbitration signal from the validation circuitry. The logic circuitry may control when the refresh control signal is permitted to cause a refresh of a DRAM memory array (e.g., DRAM device) of the electronic device based at least in part on a state of the arbitration signal. The arbitration signal may be generated by the validation circuitry in response to a detected unauthorized access attempt or a detected authorized access attempt.

Additional and/or alternative techniques for providing an internal refresh initiation signal based on the refresh control signal and the arbitration signal are described herein. These additional and/or alternative techniques include using a varying number of bits to confirm whether an access attempt is an authorized or unauthorized access attempt, using counting circuitry to track unauthorized access attempts, modulating the internal refresh initiation signal in response to an additional verification signal, random generation of a secret key used to confirm whether an access attempt is an authorized or unauthorized access attempt, and the like. It should be understood that although specific examples are described herein, any suitable method of refresh control of a DRAM memory device may be applied herein to achieve the benefits described above. It should also be understood that the techniques described herein may be used in combination with the previously described insufficient data security techniques to provide improved data security (e.g., system security) for the DRAM device.

Turning now to the figures, FIG. 1 is a simplified block diagram illustrating particular features of a system 10 including an accessing device, such as a system on a chip (SOC) 12 attempting to access a memory device 14. The memory device 14 includes validation circuitry 16 and a memory array 18. For purposes of illustrating the various embodiments described herein, the SOC 12 may be an unauthorized device used by an unauthorized user to access at least a portion of data (e.g., sensitive data) stored within the memory array 18 or an authorized device attempting to access at least a portion of data to which an authorized user should not have access, and thus is to be prevented from accessing the data by using techniques described herein. As will be appreciated, portions of the system 10 will operate normally when the SOC 12 is an authorized device operated by an authorized user, accessing data authorized to be accessible to the authorized user and device, as discussed in further detail below. In accordance with one embodiment, the memory device 14 may be a double data rate type five synchronous dynamic random access memory (DDR5 SDRAM) device. Various features of DDR5 SDRAM may permit reduced power consumption, more bandwidth and more storage capacity compared to prior generations of DDR SDRAM.

The memory device 14, may include a number of memory banks within the memory array 18. The memory array 18 may be a dynamic random access memory (DRAM) device and thus the memory device 14 may use periodic refreshing to maintain data stored within the memory array 18 and/or the memory banks. The memory banks may be DDR5 SDRAM memory banks, for instance. The memory array 18 may be provided on one or more chips (e.g., SDRAM chips) that are arranged on dual inline memory modules (DIMMS). Each DIMM may include a number of SDRAM memory chips (e.g., ×8 or ×16 memory chips). Each SDRAM memory chip may include one or more of the memory banks. The memory device 14 represents a portion of a single memory chip (e.g., SDRAM chip) having access to a number of memory banks. For DDR5, memory banks may be further arranged to form bank groups. For instance, for an 8 gigabit (Gb) DDR5 SDRAM, the memory chip may include 16 memory banks, arranged into 8 bank groups, each bank group including 2 memory banks. For a 16 Gb DDR5 SDRAM, the memory chip may include 32 memory banks, arranged into 8 bank groups, each bank group including 4 memory banks, for instance. Various other configurations, organization and sizes of the memory array 18 may be utilized depending on the application and design of the overall system (e.g., system 10).

The memory device 14 may include a command decoder 20 and an input/output (I/O) interface associated with the command decoder 20 for exchanging (e.g., receiving and transmitting) signals with external devices, such as the SOC 12. The command decoder 20 may decode commands, such as read commands, write commands, mode-register set commands, activate commands, etc., and provide an external device access to a particular memory bank of the memory array 18 corresponding to the command received via a command bus 22. As may be appreciated, the memory device 14 may include various other decoders, such as row decoders and column decoders, to facilitate access to the memory array 18.

The command decoder 20 is configured to provide a number of signals based on signals received from the SOC 12, such as to a controller 24. The controller 24 may provide various signals to components of the memory device 14 to facilitate the transmission and receipt of data to be written to or read from the memory device 14, such as one or more signals transmitted through the command bus 22. The command decoder 20 may also include a number of circuits, such as various clock input circuitry and/or command address input circuitry, for instance, to permit proper handling of the signals (e.g., transmitted via the command bus 22). Although not depicted, the command decoder 20 may receive one or more clock signals from an external device (e.g., SOC 12) to facilitate transmission of the command signals. For DDR memory devices, commands (e.g., read command, write command, etc.) are typically entered on the positive edges of the clock signal (e.g., rising edge) and data is transmitted or received on both the positive and negative clock edges (e.g., falling edge), however any suitable combination of clocking and command signals may be used.

Thus, in general, the command decoder 20 may receive command signals from the command bus 22 and may decode the command signals to provide various internal commands. For instance, the command decoder 20 may provide command signals (e.g., an auto-refresh (AR) signal 26) to the controller 24 that generates an inverse auto-refresh (ARF) signal 28 in response to the command signals. The controller 24 may include any number of control block logic circuits to cause the generation of the inverse auto-refresh (ARF) signal 28. The inverse auto-refresh (ARF) signal 28 propagates through logic circuitry 30 to initiate internal refresh operations of the memory array 18.

In some embodiments, the memory device 14 may be disposed in (physically integrated into or otherwise connected to) a host device or otherwise coupled to a host device. For purposes of this disclosure, the SOC 12 may be considered the host device, albeit an unauthorized host device, and is discussed below specifically to describe general characteristics of host devices and authorized (or unauthorized) SOCs 12. The memory device 14 may receive commands at the command decoder 20 from the SOC 12. The SOC 12 may be included in any one of a desktop computer, laptop computer, pager, cellular phone, personal organizer, portable audio player, control circuit, camera, etc. The SOC 12 may also be included in a network node, such as a router, a server, or a client (e.g., one of the previously-described types of computers). The SOC 12 may be included in some other sort of electronic device, such as a copier, a scanner, a printer, a game console, a television, a set-top video distribution or recording system, a cable box, a personal digital media player, a factory automation system, an automotive computer system, or a medical device. The terms used to describe these various examples of systems, like many of the other terms used herein, may share some referents and, as such, should not be construed narrowly in virtue of the other items listed.

The SOC 12 may, thus, be a processor-based device, which may include a processor, such as a microprocessor, that controls the processing of system functions and requests in the SOC 12. Further, any host processor may include one or more processors that share system control. The host processor may be coupled directly or indirectly to additional system elements of the SOC 12, such that the host processor controls the operation of the SOC 12 by executing instructions that may be stored within the SOC 12 or external to the SOC 12.

As discussed above, data may be written to and read from the memory device 14, for example, by the SOC 12 whereby the memory device 14 operates as volatile memory, such as Double Data Rate DRAM (e.g., DDR5 SDRAM). The SOC 12 may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., not-and (NAND) memory, not-or (NOR) memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the SOC 12 may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to permit a user to input data into the SOC 12, for example, buttons, switching elements, a keyboard, a light pen, a stylus, a mouse, and/or a voice recognition system, for instance. The SOC 12 may optionally also include an output device, such as a display coupled to the processor and a network interface device, such as a Network Interface Card (NIC), for interfacing with a network, such as the Internet. As will be appreciated, the SOC 12 may include many other components, depending on the application of the SOC 12 and/or of the system 10.

When the SOC 12 is an authorized host device, the SOC 12 may operate to transfer data to the memory device 14 for storage and may read data from the memory device 14 to perform various operations at the SOC 12. In some embodiments, sensitive data may be stored within the memory device 14. Thus it may be desirable to protect the sensitive data from unauthorized access attempts (e.g., by the unauthorized SOC 12). Accordingly, to facilitate and promote valid and/or authorized data transmissions, in some embodiments, the memory device 14 may include the validation circuitry 16 that operates in coordination with the command decoder 20 to verify and permit access to the memory array 18 by a host device (e.g., an authorized SOC 12).

To elaborate on the validation circuitry 16 and the command decoder 20, the command decoder 20 may provide command signals (e.g., auto-refresh (AR) signal 26) to a register 32. The register 32, upon receipt of the command signal from the command decoder 20, may be loaded with an identifier 34 transmitted via an address bus 36. The identifier 34 is a signal transmitted from the SOC 12 to the memory device 14 and includes information used in refresh operations. The identifier 34 via the address bus 36 and the command via the command bus 22 may be received by the memory device 14 at a substantially similar time, such as in response to a refresh command from the SOC 12 or an access attempt by the SOC 12. It should be understood that, although not specifically depicted, an input buffer or other suitable receiving circuitry, may initially receive the identifier 34 and/or any input signal to the memory device 14 before transmission to an additional component. For example, an input buffer may receive the identifier 34 and may transmit the identifier to the register 32. In this way, the input buffer and/or additional circuitry may be used to process any input to the memory device 14 before use in an operation or before transmission to another component. For example, an input buffer that receives the identifier 34 may process and/or improve the signal associated with the identifier 34 before operating to transmit the identifier 34 to the register 32. In this way, the input buffer may also receive a command from the command bus 22 before the command decoder 20 and may operate to transmit the command onto the command decoder 20 (e.g., such as after improving signal integrity associated with the command). At power-up (e.g., power-on from an off-state or power-removed state), the register 32 may receive a toggled power-up reset signal (PwrUpRst) 37 to initiate a clearing or resetting of values stored in the register 32. The address bus 36 (and any depicted data path) may be any suitable wired or wireless coupling between components of the depicted system 10 such that the SOC 12 is communicatively coupled to the memory array 18 via the address bus 36 and/or the command bus 22. In this way, the register 32 may include one or more flip-flops or other suitable storage circuitry to temporarily store the identifier 34. The register 32 may output the identifier 34 (X) to logic circuitry 38 that validates the SOC 12 based at least in part on the identifier 34 transmitted from the register 32. The identifier 34 may act to verify and authorize the SOC 12 to permit the SOC 12 to access of the memory array 18 in response to the command transmitted via the command bus 22. The register 32 default output may cause an output from the validation circuitry 16 to be interpreted by the logic circuitry 30 as not-matching and/or not-validated, and in this way, a valid identifier is to be provided to the memory device 14 (e.g., specifically, the validation circuitry 16) to permit refresh operations to occur.

As described above, authorization of the SOC 12 may be permitted based at least in part on an output (e.g., arbitration signal 40, Z) from the validation circuitry 16. The validation circuitry 16 may use logic circuitry, such as the logic circuitry 38 (e.g., exclusive-or, XOR), to generate the above-described arbitration signal 40. In general, when the identifier 34 from the SOC 12 matches a secret key 42, the arbitration signal 40 generated permits propagation of the inverse auto-refresh (ARF) signal through the logic circuitry 30 to the memory array 18.

The secret key 42 may be a fuse-base, hardcoded value pre-programmed during manufacturing. Thus, the secret key 42 is a secure value that is shared between the device manufacturer and the authorized user and/or original owner of the memory device 14 (e.g., thus is a preset secret key known by one or more authorized SOCs and unknown by unauthorized SOCs). In this way, authorized users may know the identifier 34 to provide to the validation circuitry 16 to match the secret key 42. When the identifier 34 does not match the secret key 42, access is prohibited and internal refreshing is not permitted (thereby causing automatic erasure of at least a portion of data within the memory array 18).

In some embodiments, a security code calculator 44 may be included in the memory device 14. The security code calculator 44 may improve security by modifying the secret key 42 before transmitting to the logic circuitry 38. The secret key 42 may be unique to each memory device 14 manufactured and thus using the security code calculator 44 may further modify and change the unique secret key 42. In some embodiments, the security code calculator 44 receives a refresh signal 45 to initiate a clearing or resetting of values stored or used in the security code calculator 44, which, in some cases may be the same as power-up reset signal (PwrUpRst) 37.

As depicted, the validation circuitry 16 is employed using an XOR gate (e.g., logic circuitry 38), the security code calculator 44, the secret key 42, and the register 32. However, it should be understood that any suitable combination of logic components and functional components may be included in the validation circuitry 16 as a way to permit refreshing operations of the memory array 18 to occur in response to authorized access requests. To explain the illustrated example, when the inputs to the XOR gate match (e.g., both 1, both 0), the XOR gate outputs a logic low signal (e.g., 0), and when the inputs do not match (e.g., 1 and 0), the XOR gate outputs a logic high signal (e.g., 1). Thus, the logic circuitry 30 may include use of a not-or (NOR) gate such that when either input into the logic circuitry 30 equals a logic high (e.g., 1), the output from the logic circuitry 30 is forced low. As a reminder, the output (e.g., internal refresh signal 46) from the logic circuitry 30 initiates at least in part internal refreshing of the memory array 18. Thus, a logic low (e.g., 0) output may prevent refreshing from occurring and therefore cause intentional data loss in response to the unauthorized access attempt by the SOC 12 (e.g., having the non-matching identifier 34).

Figure 2:
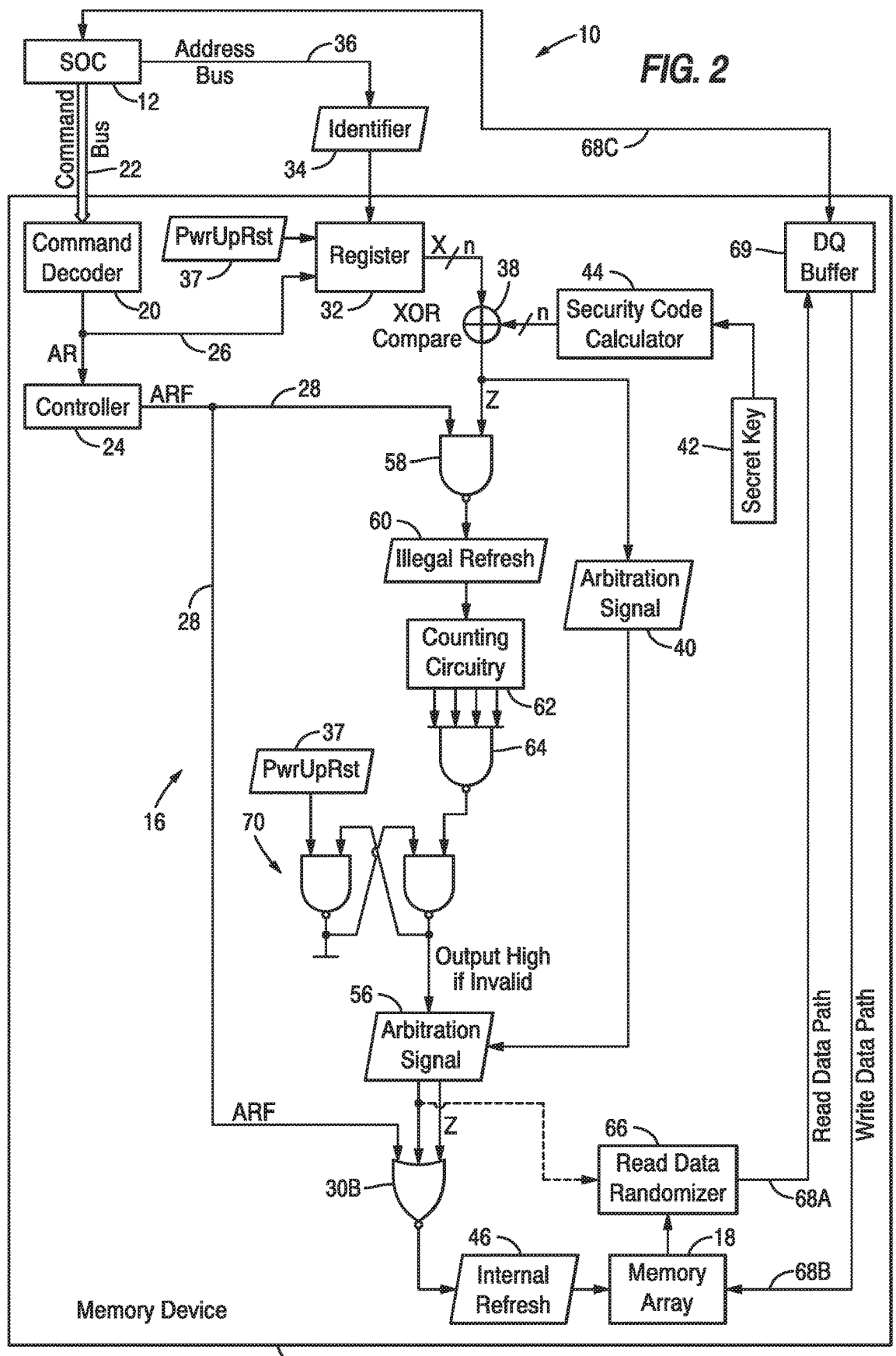
FIG. 2 is a block diagram of the memory device of FIG. 1 including another example of validation circuitry, in accordance with an embodiment.

FIG. 2 is a block diagram depicting another example of the above-described validation circuitry 16. As depicted, an additional arbitration signal 56 is input to an embodiment of logic circuitry 30, i.e., logic circuitry 30B, to permit refresh operations to occur. In particular, FIG. 2 depicts the logic circuitry 38 as the XOR gate transmitting its arbitration signal 40 output to logic circuitry 58 (e.g., NAND gate). The logic circuitry 58 also receives the inverse auto-refresh (ARF) signal 28 from the controller 24. The logic circuitry 58 may output low (e.g., 0) when both of the inputs are high (e.g., 1). In this way, the auto-refresh (AR) signal 28 is to be initiated (e.g., causing the inverse signal to be low, 0) and the arbitration signal 40 is to be high (e.g., 1, representing that identifier 34 did not match at least a portion of the secret key 42) to toggle an illegal refresh signal 60 to high (e.g., 1).

Counting circuitry 62 receives the illegal refresh signal 60. When the illegal refresh signal 60 is high (e.g., 1), the counting circuitry 62 responds by suitably incrementing. The counting circuitry 62 thus tracks an amount of unauthorized access attempts. The counting circuitry 62 outputs each bit of the tracked count to logic circuitry 64, where each bit of the tracked count is transmitted in parallel to the logic circuitry 64. In this way, the counting circuitry 62 may use binary states to count a number of the authorized access attempts. When each bit is high (e.g., 1), the logic circuitry 64 may toggle its output, ultimately driving the logic circuitry 30B to output low (e.g., 0). It should be noted that in this disclosure a variety of logic gates are discussed, however it should be understood that the depicted logic gates may each be replaced with used in combination with a variety of valid logic gates, including NAND gates, NOR gates, XOR gates, AND gates, OR gates, inverting gates, or the like (even if not explicitly called out herein).

In some embodiments, a read data randomizer component 66 is included at the output from the memory array 18. The read data randomizer component 66 may randomize any data output from the memory array 18. The randomizing may happen automatically in response to detection of a threshold number of unauthorized access attempts tracked by the counting circuitry 62 and indicated through arbitration signal 56. Randomized read data may be output from the read data randomizer component 66 to data (DQ) paths 68 (e.g., 68A, 68B, 68C). A data buffer 69 may be located at an edge of the memory device 14 to facilitate transfer of data between the memory device 14 and the SOC 12. The data paths 68 may include a read data path 68A, a write data path 68B, and an I/O bus data path 68C. The read data path 68A may transmit any read data through the read data randomizer component 66, which may operate to selectively randomize read data in response to detection of a threshold number of unauthorized access attempts. In some embodiments, a multiplexing circuit may be used between the memory array 18 and the DQ buffer 69 to selectively transmit data through the read data randomizer component 66 in response to detection of a threshold number of unauthorized access attempts. Although not specifically described in each figure of this disclosure, it should be understood that the read data randomizer component 66 may be used in conjunction or in alternate of any of the systems and/or methods described herein.

In addition, in some embodiments (and as depicted), a latching circuit 70 may be included between the output from the logic circuitry 64 and the input to the logic circuitry 30B. The latching circuit 70 may temporarily halt and/or store the output from the logic circuitry 64 before permitting transmission to the logic circuitry 30B. This may be caused by the latching circuit 70 receiving the power-up reset signal (PwrUpRst) 37 having a high state (e.g., 1) therefore permitting the state of the output from the logic circuitry 64 to control the output from the latching circuit 70. Since the latching circuit 70 is depicted as a set-reset (SR) latch, the output from the latching circuit 70 is unchanged when the output from the logic circuitry 64 is high (e.g., 1) but changes to a high signal (e.g., 1) when the output from the logic circuitry 64 is low (e.g., 0). In this way, when the output from the logic circuitry 64 is low (e.g., 1), the output from the switching circuit 70 is forced high (e.g., 1) thereby causing the read data randomizer component 66 to randomize data output from the memory array 18 and causing the internal refresh operations to halt via the logic circuitry 30B. Although depicted as an SR latch, it should be understood that any suitable logic circuit may be used to arbitrate transmission of the output from the logic circuitry 64. The latching circuit 70 may increase control over when to permit the validation circuitry 16 to control or halt refreshing operations.

Figure 3:
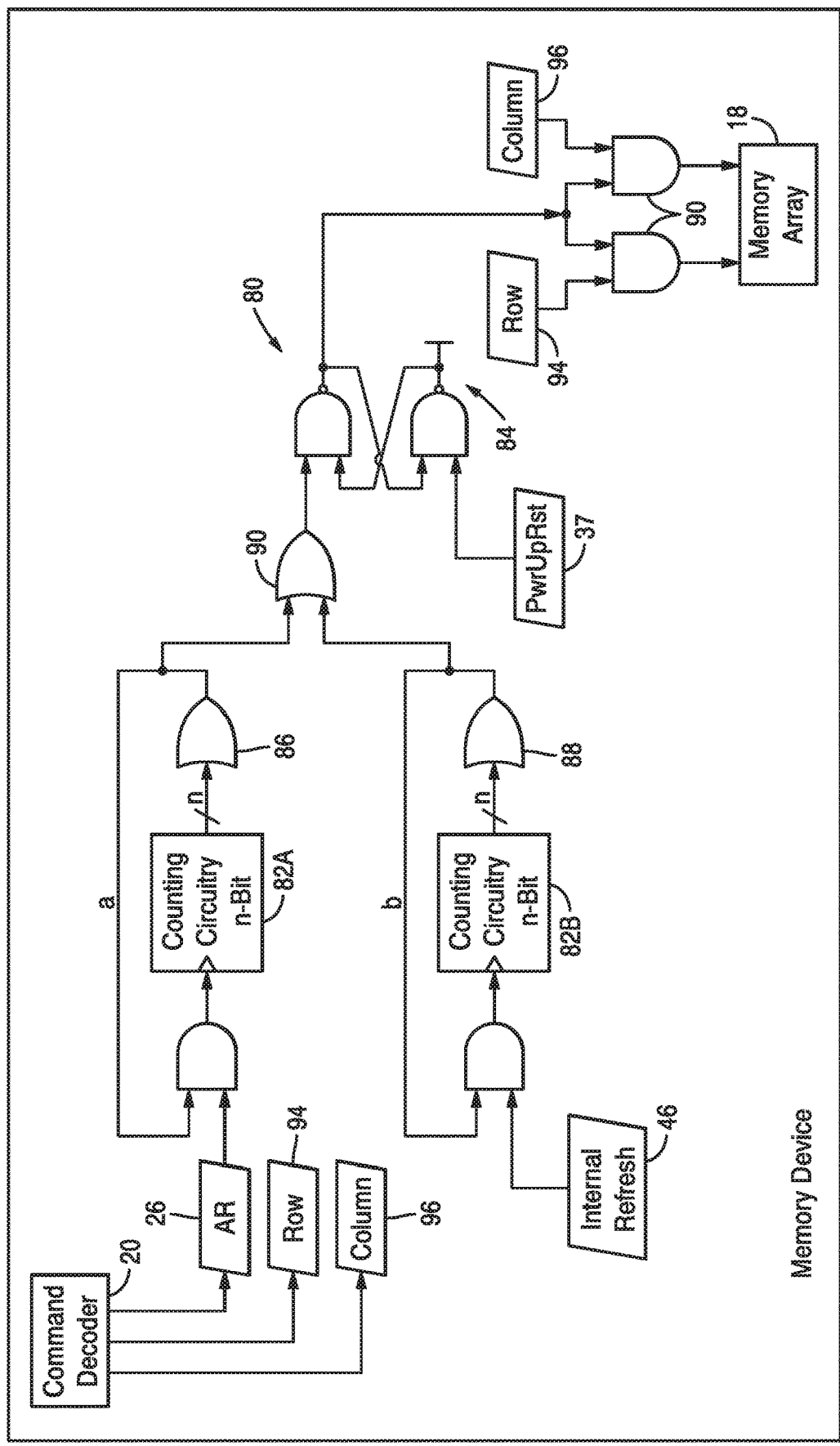
FIG. 3 is a block diagram of refresh initialization circuitry used in conjunction with the memory device of FIG. 1, in accordance with an embodiment.

FIG. 3 is a block diagram depicting refresh initialization circuitry 80 that may be used at least in part with the memory device 14. In particular, the refresh initialization circuitry 80 may include one or more counting circuits or circuitry 82 (e.g., 82A, 82B), that may receive the auto-refresh (AR) signal 26 from the command decoder 20 and/or the internal refresh signal 46. The internal refresh signal may originate from the logic circuitry 30 or the logic circuitry 30B.

In response to receiving the auto-refresh (AR) signal 26 or the internal refresh signal 46, the counting circuitry 82 operates to increment or decrement by a predetermined count as a way to track how many auto-refresh (AR) signals have been transmitted or to track how many validated internal refreshes are permitted. In the depicted example that uses an SR switch as latching circuitry 84, the counting circuitry 82 decrements from a high value (e.g., 11) to zero (e.g., 00). While the counting circuitry 82 counts to zero (e.g., 00), the outputs from the counting circuitry 82 respectively output to either logic circuitry 86 or logic circuitry 88. When both the logic circuitry 86 and the logic circuitry 88 transmit low (e.g., 0) and both the counting circuitry 82A and 82B have reached zero (e.g., 00), logic circuitry 90 that outputs based at least in part on inputs from the logic circuitry 86 and the logic circuitry 88 outputs low (e.g., 0). When the logic circuitry 90 output toggles from high (e.g., 1) to low (e.g., 0), the latching circuitry 84 outputs a high signal (e.g., 1) indicating to row-column mitigation circuitry 92 that a particular number of auto-refresh cycles have been validated. Upon validation of the auto-refresh cycles, the row-column mitigation circuitry 92 permits the command decoder 20 to address various rows and columns within the memory array 18 via row address signal 94 and column address signal 96. The validation may continue to be granted and/or transmitted from the latching circuitry 84 until the power-up reset signal (PwrUpRst) 37 is reset to low (e.g., 0).

The refresh initialization circuitry 80 may be used in a variety of computing system including computers, mobile devices, and so forth. The row-column mitigation circuitry 92 may remain in a locked state (e.g., not permitting the command decoder 20 to access the memory array 18) unless 4 auto-refresh (AR) signals are suitably validated (or a number otherwise counted to by the counting circuitry 82). This helps to prevent unauthorized access to the memory array 18. In this way, if any of the 4 auto-refresh (AR) signals are not validated, the locked state is maintained.

Figure 4:
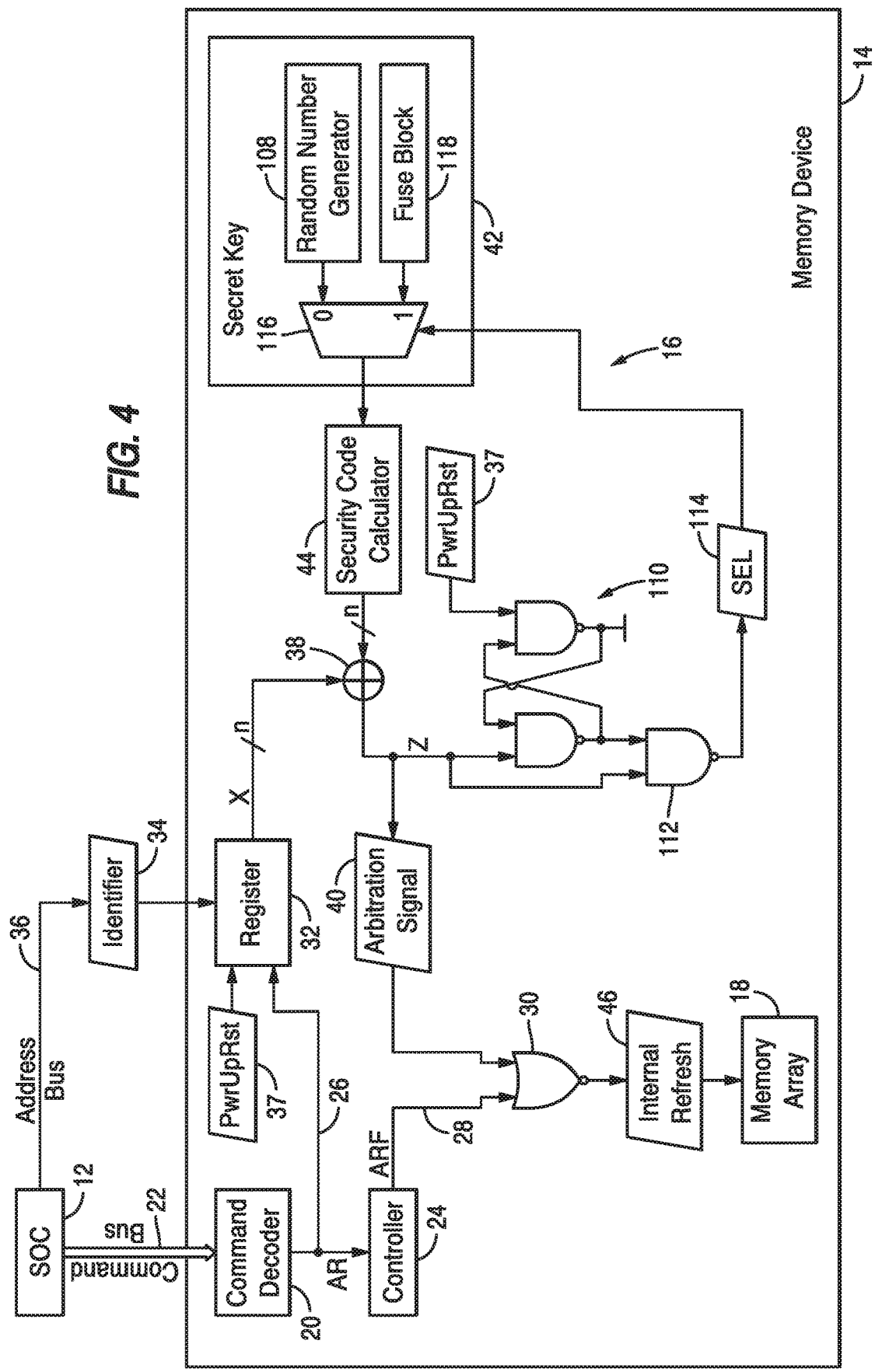
FIG. 4 is a block diagram of the memory device of FIG. 1 including another example of validation circuitry that may use a random number generator, in accordance with an embodiment.

FIG. 4 is a block diagram of the memory device 14 of FIG. 1 including another example of validation circuitry 16 that may use a random number generator 108. The random number generator 108 may be of particular use in a system 10 that uses a reduced number of command-address input pads to receive the identifier 34. For example, FIG. 2 may use a higher number of address bits (e.g., 12 bits or 14 bits) than the example shown in FIG. 4, which may use, for example, 3 bits. In this way, the circuitry used in FIG. 4 may be of particular use in small-scale electronic circuitry that may be desired to protect sensitive data, such as devices used for internet-of-things applications, mobile devices, phones, or the like.

As depicted, latching circuitry 110 (e.g., an SR switch or other suitable logic circuit) receives both the power-up reset signal (PwrUpRst) 37 and the arbitration signal 40. The latching circuitry 110 may output a high signal (e.g., 1) when the arbitration signal 40 is low (e.g., 0) and the power-up reset signal is high (e.g., 1). In this way, when the logic circuitry 38 determines that the identifier 34 matches the secret key 42 and the power-up reset signal (PwrUpRst) 37 is enabled, the output is high (e.g., 1). The high output may cause logic circuitry 112 to output low (e.g., 0) since, as depicted, the logic circuitry 112 receives a high signal (e.g., 1) and a low signal (e.g., 0) and therefore outputs a high signal (e.g., 1) as a selection output (SEL) 114. It should be understood that although the logic circuitry 112 is depicted as a NAND gate, any suitable combination of logic gates may be used including NOR gates, AND gates, OR gates, inverting gates, XOR gates, or the like.

The selection output (SEL) 114 may be used to drive selection circuitry 116 (e.g., multiplexing circuitry or any suitable arbitration circuitry) to select a particular output from various inputs which create the secret key 42. In this way, the selection output (SEL) 114 having a high value may select an output from a fuse block 118 while the selection output (SEL) 114 having a low value may select an output from a random number generator 108. The selection circuitry 116 may arbitrate transmission of the secret key 42. Thus, either a random value from the random number generator 108 or a set value from the fuse block 118 is to be transmitted by the selection circuitry 116 as the secret key 42.

During operation, the identifier 34 may be determined invalid by the validation circuitry 16, thereby causing the arbitration signal 40 to be high (e.g., 1 in response to the identifier 34 not matching the secret key 42). Upon reception of the arbitration signal 40, the latching circuitry 110 may toggle the selection output (SEL) 114. This may result in the selection circuitry 116 outputting the random value from the random number generator 108 as the next secret key 42. Thus, from the time that a first invalid identifier 34 is transmitted to the validation circuitry 16, access is essentially prevented to the memory array 18 and refreshing operations are halted. This is because the secret key 42 is now equal to the random value from the random number generator 108 instead of the set value from the fuse block 118. Operating the memory device 14 in this way may provide an efficient and straightforward means of protecting sensitive data within the memory array 18 since the unauthorized user may be unable to guess the randomized secret key 42, even if the secret key 42 is only able to have a reduced number of bits. To phrase differently, no longer are laws of probability relied upon to provide security (e.g., a set secret key 42 of a large number of bits is hard to guess) since the security may be enabled through providing a dynamic secret key 42 (e.g., a random secret key 42 that is changed each time a validation operation is performed is very difficult to guess and therefore is an improved solution over previous secret keys 42).

Figure 5:
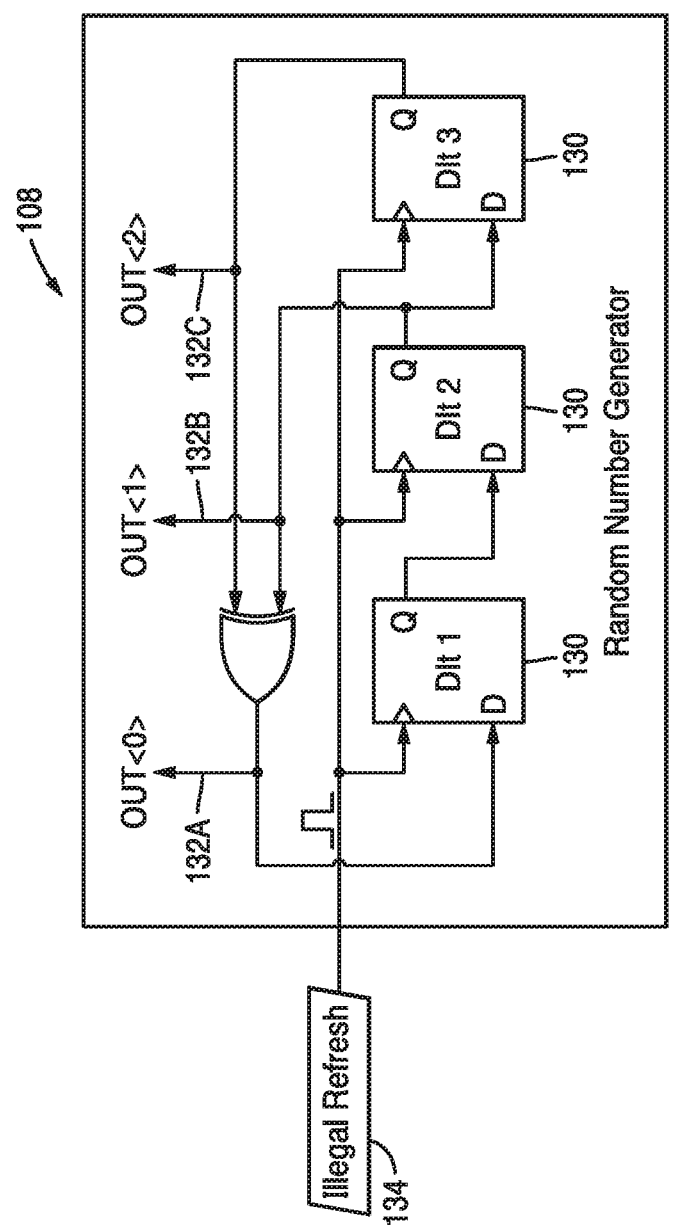
FIG. 5 is a block diagram of an example of the random number generator of FIG. 4, in accordance with an embodiment.

FIG. 5 depicts an example of the random number generator 108. The random number generator 108 may include an n-number of flip-flops 130 that corresponds to the number of bits the final random number is to be represented with. In the example shown in FIG. 4, the random number is to be represented by 3 bits, thus 3 flip-flops 130 are used to generate the random number. The bits of the random number are output via paths 132 (132A, 132B, and 132C). It should be understood that this is merely one example of a suitable random number generator and that a variety of suitable random number generators may be used as the random number generator 108, and may include components that use more or less logic circuitry.

As depicted, the random number generator 108 receives and is clocked by an illegal refresh signal 134 output from, for example, the validation circuitry 16. It should be understood that a variety of circuitry may be used to determine and track invalid access attempts, and that the illegal refresh signal 134 may be generated in response to the invalid access attempts (e.g., as a security precaution). For example, the illegal refresh signal 134 may be derived from the arbitration signal 40, the illegal refresh signal 60, or any other suitable signal described herein that is generated or toggled in response to detecting an authorized or unauthorized access attempts. In response to receiving the illegal refresh signal 134, the random number generator 108 is clocked and driven to output a random number via the paths 132. It is noted that the total number of combinations of random numbers equals a total number of binary combinations possible based on the number of bits representing the random number output (e.g., 3 bits leads to 8 combinations, thus the random number generated is a binary value representing a value between 0, 000, and 7, 111).

Figure 6:
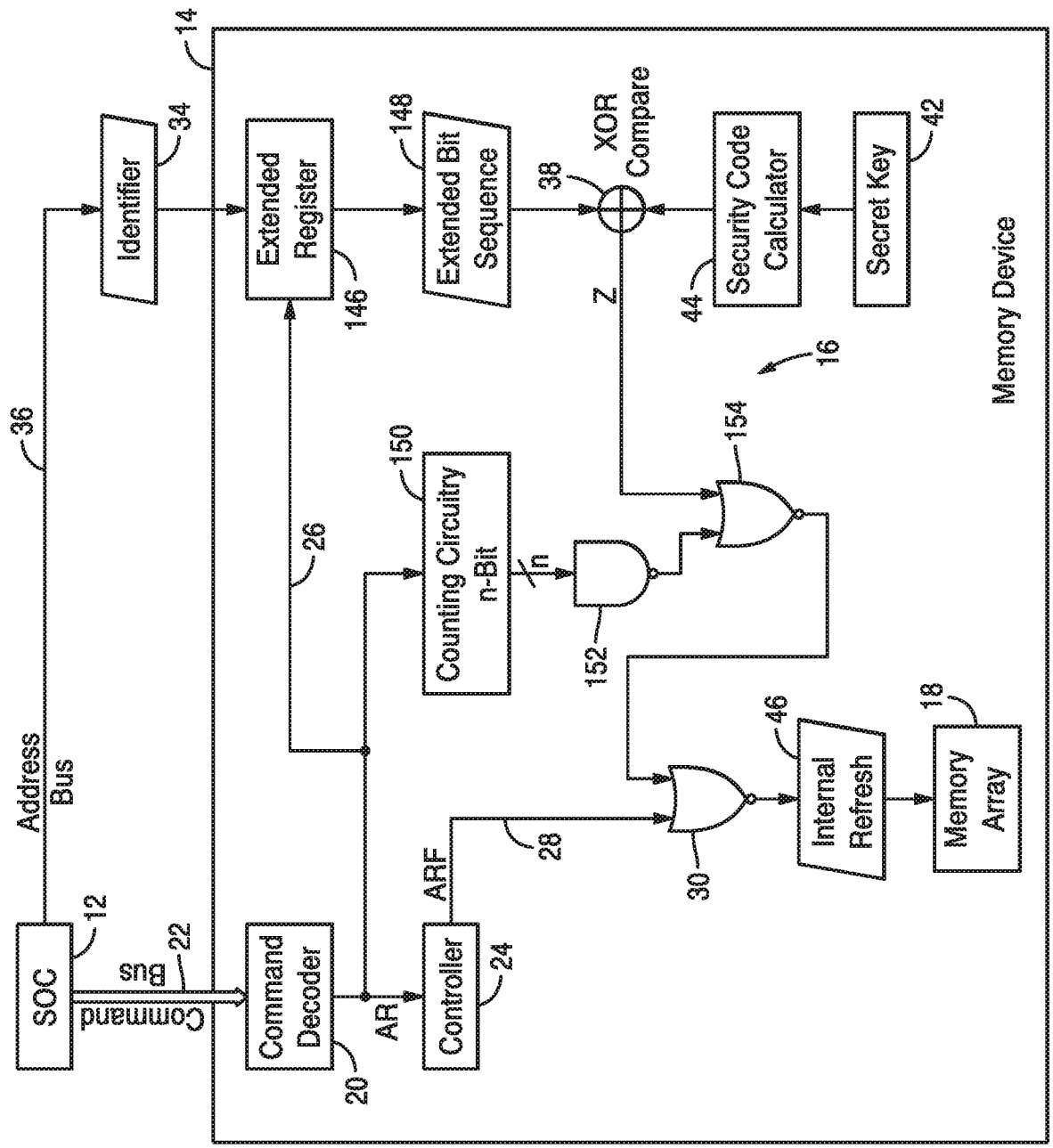
FIG. 6 is block diagram of the memory device of FIG. 1 including another example of validation circuitry that may use an extended register, in accordance with an embodiment.

FIG. 6 is a block diagram of the memory device 14 including another example of validation circuitry that leverages an extended register 146 to increase or maintain memory array 18 security even when using a reduced number of command-address input pads (e.g., for example, a reduction from 12 to 3 command-address input pads) to generate the input identifier. For example, FIG. 2 may use a higher number of address bits than the example shown in FIG. 4, which may use, for example, 3 bits. It may be assumed that a higher number of address bits may permit a higher number of bits to be used to define the secret key 42 (and security code outputted but the security code calculator 44) and the identifier 34. However, strategically extending a small number of bits into the higher number of bits may permit a smaller electronic device that may have a small number of command-address input pads to be as secure as larger electronic devices that have a larger number of command-address input pads (e.g., at least in terms of complexity or bit-length of secret key 42).

For example, the SOC 12 may transmit 3 bits via the address bus 36. The extended register 146 may receive these 3 bits and extend the values into an extended bit sequence 148, such as a 12-bit or 14-bit sequence. The extended bit sequence 148 may then be validated by the logic circuitry 38 using a bit-wise XOR comparison or any other suitable validation technique against the secret key 42 and/or the security code outputted but the security code calculator 44 having a bit-length equal to the bit-length of the extended bit sequence 148. Thus, a longer bit sequence may be generated from a lesser number of bits, facilitating and increasing security of the memory array 18.

To explain the depicted example, the command decoder 20 outputs the auto-refresh (AR) signal 26. Counting circuitry 150 receives the auto-refresh (AR) signal 26 and tracks the number of auto-refreshes initiated by the command decoder 20 via a binary state of its outputs (e.g., 00-01-10-11). When the counting circuitry 150 reaches its max state (e.g., 11), logic circuitry 152 coupled to the output of the counting circuitry 150 outputs a low signal (e.g., 0). This low signal propagates to logic circuitry 154 and the logic circuitry 30 outputs, based on the state of the arbitration signal 40. That is, the arbitration signal 40 is low (e.g., 0) when the extended bit sequence 148 (e.g., 12-bit identifier) does not match the security code calculator 44 output (e.g., a 12-bit security code output by the security code calculator 44) but it high when the extended bit sequence 148 does match the security code calculator 44 output. This permits the output from the logic circuitry 154 to toggle in response to whether the extended bit sequence 148 matches the secret key 42 on the fourth clock transition (e.g., defined by the binary states of the counting circuitry 150). Based on the combinational logic described above, the logic circuitry 30 outputs the internal refresh signal 46. A low (e.g., 0) internal refresh signal 46 may be interpreted by the memory array 18 as an indication to halt refreshing operations.

Figure 7:
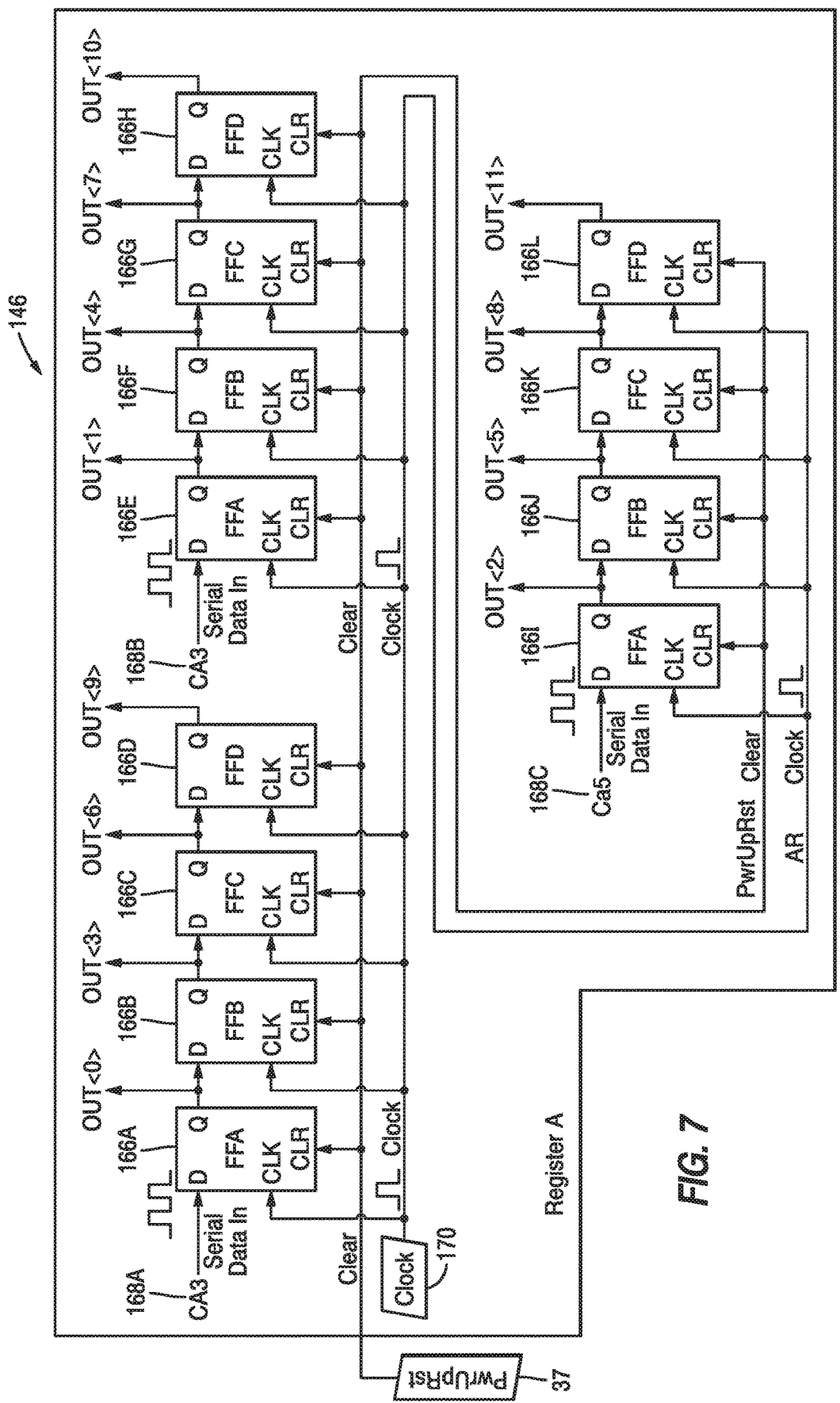
FIG. 7 is a block diagram of an example of the extended register of FIG. 6, in accordance with an embodiment.

To help explain, FIG. 7 is a block diagram of an example of the extended register 146 of FIG. 6. In this example, flip-flops 166 (e.g., 166A-166L) are included in the extended register 146 as a way to extend a number of bits that the identifier 34 is represented by. It is noted that the number of bits used in the counting circuitry 150 matches the number of bits between each of the input pads 168 (e.g., 168A, 168B, 168C) of the extended register 146 and the number of clock transitions between the valid toggling of the internal refresh signal 46 in response to the actual matching/unmatching state of the extended bit sequence 148 and the secret key 42. In this way, in some embodiments, a number of bits representing the count of the counting circuitry 150, a number of clock transitions, and the number of flip-flops 166 between the respective input pads 168 may be different than 4, as described above.

As depicted, 3 input pads 168 each receive a respective command-address input (e.g., CA3, CA4, CA5). These values are clocked through each of the flip-flops 166 (e.g., in response to a rising or falling edge of a clock signal 170 for the memory device 14). For the depicted example, after 4 clock transitions, the 3 bits first received at the input pads 168 may reside in different bit positions and correspond to each fourth flip-flop (e.g., 166D, 166H, 166L). It is noted that the number of clock transitions corresponds to a number of flip-flops 166 are coupled in series between the respective input pads 168. In this way, additional bit values transmitted to the input pads 168 may be clocked in to fill the other bit positions with subsequently transmitted identifier 34 data.

This technique enables a 3-bit command-address input (e.g., identifier 34) to be extended into a 12-bit identifier (e.g., extended bit sequence 148) that is to match the corresponding 12-bit the security code calculator 44 output to be considered a validated access request. Using this technique may mean that 3 of 4 memory access attempts are permitted before an unauthorized memory access attempt may be recognized. This is not a problem since refreshing of the memory array 18 may be halted after detection of an unauthorized memory access attempt by the validation circuitry 16. In some embodiments, the power-up reset signal (PwrUpRst) 37 may be used to reset a state of the flip-flops 166 upon toggling.

Figure 8:
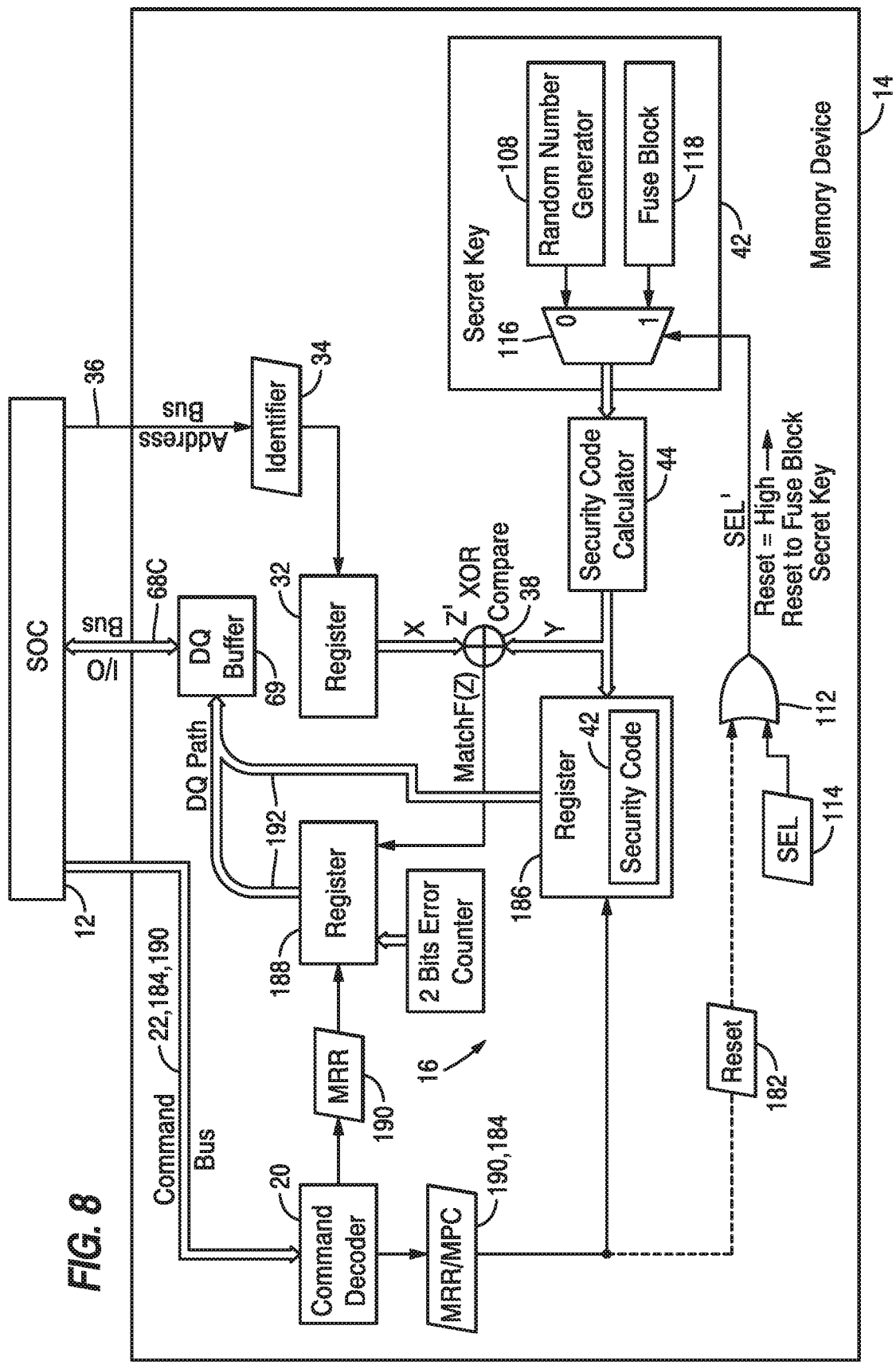
FIG. 8 is a block diagram of the memory device of FIG. 1 including another example of validation circuitry as used in a system to communicate with a system on a chip (SOC), in accordance with an embodiment.

FIG. 8 is a block diagram of an example of the memory device 14 accessed by a system on a chip (SOC) 180 that may be designed to reset (e.g., via at least reset signal 182) the validation circuitry 16 and other circuitry described herein in response to a determination that an authorized user has taken possession of the memory device 14 again. The SOC 180 may output a multi-purpose command (MPC) 184 via the command bus 22 to the command decoder 20. The command decoder 20 may initiate a reset signal 182 on behalf of the SOC 180 to reset the selection circuitry 116 to output data from the fuse block 118 as the secret key 42 (e.g., depicted as stored in a register 186). This permits the authorized user to re-enter the identifier 34 and suitably match the the security code calculator 44 output based on the secret key 42 from the fuse block 118, thereby regaining access to the memory array 18.

In some embodiments, a register 188 stores the arbitration signal 40. The register 188 may save this value in such a manner that permits the SOC 180 to access and/or monitor the validation result (e.g., arbitration signal 40 value) by transmitting a mode register read (MRR) command 190 to the command decoder 20. The command decoder 20 may, in response to the mode register read (MRR) command 190, instruct the register 188 to transmit the data corresponding to the arbitration signal 40 value via a DQ path 192 to the SOC 180.

In a similar manner, the SOC 180 may poll the memory device 14 to determine what the current secret key 42 is by transmitting a suitable mode register read (MRR) command 190 to the command decoder 20. In response to the mode register read (MRR) command 190, the command decoder 20 may instruct the register 186 storing the secret key 42 to output an indication of the secret key 42 to the SOC 180 via the DQ path 192. Each of these described commands may be uniquely programmed for each customer, and in this way, just the particular and authorized customer may be granted access to the command decoder 20.

Figure 9:
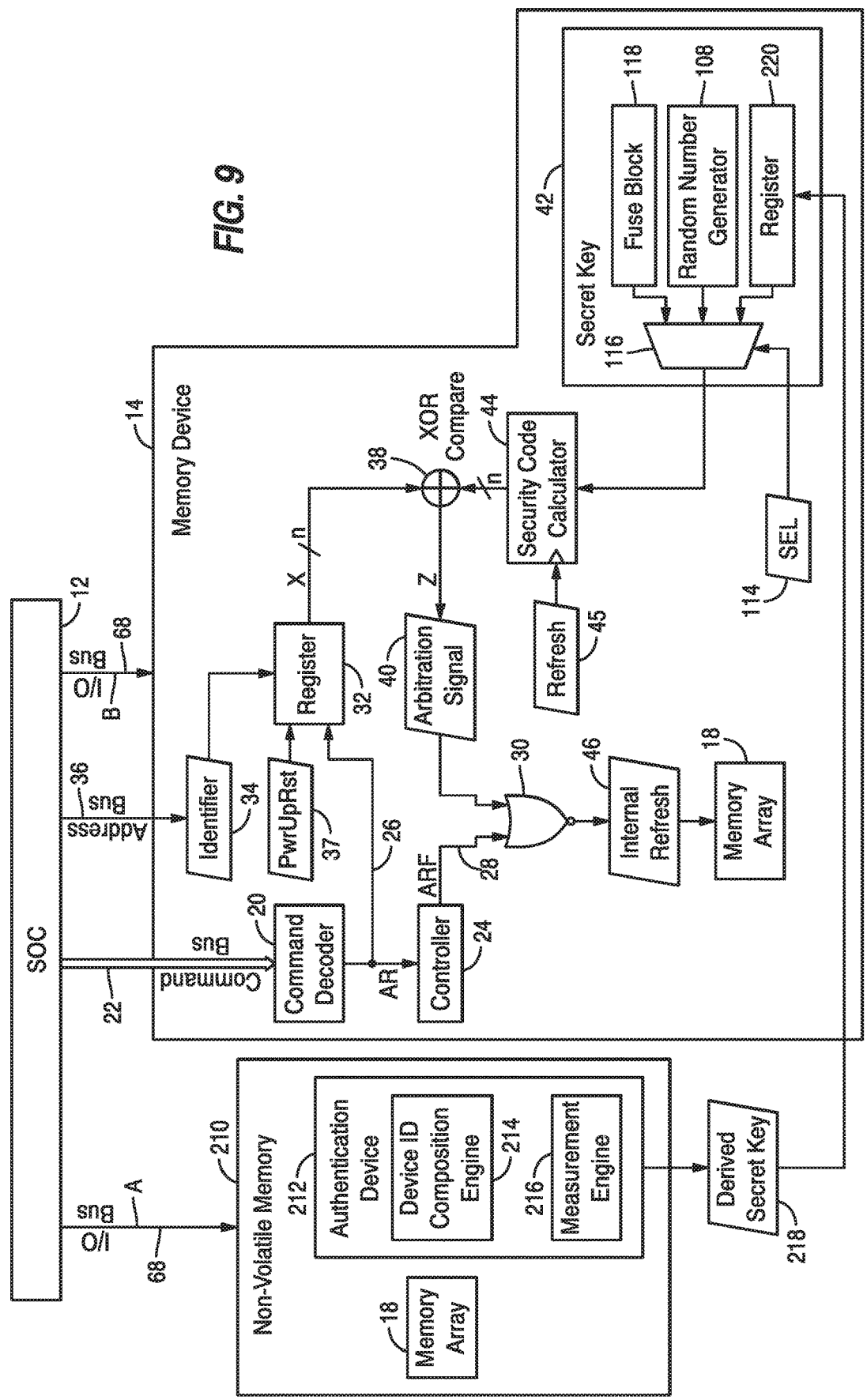
FIG. 9 is a block diagram of another example of the memory device of FIG. 1, in accordance with a second embodiment.

With the forgoing in mind, FIG. 9 is a block diagram of another example of the memory device 14. In this example, the memory device 14 includes a separate non-volatile memory 210. Thus, FIG. 9 depicts an example collaboration between flash-memory products built on a platform of internet of things (IoT) device security and the memory device 14. As described earlier, the non-volatile memory 210 may include in its memory array 18 read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., not-and (NAND) memory, not-or (NOR) memory, etc.) as well as other types of memory devices (e.g., storage), such as solid state drives (SSD's), MultimediaMediaCards (MMC's), SecureDigital (SD) cards, CompactFlash (CF) cards, or any other suitable device. The non-volatile memory 210 is not refreshed to maintain data stored within the memory array 18. The memory array 18 of the non-volatile memory 210 may store data corresponding to stored data, applications and/or software programs, operating systems, power-on boot code, or the like. In this way, the memory array 18 of the non-volatile memory 210 may store data used in operation of the IoT device and/or the electronic device associated with the memory device 14.

The non-volatile memory 210 may also include an authentication device 212. The authentication device 212 may include a device identification composition engine (DICE) 214 and a measurement engine 216. The measurement engine 216 may monitor health of an internet of things (IoT) device or other electronic device associated with the memory device 14 (e.g., that uses the memory device 14 for storage and/or memory). The measurement engine 216 may make a cryptographic measurement that corresponds to a relative health of firmware on the IoT device. These health-related measurements may be stored in a similar location as a secret key associated with the memory device 14. The DICE 214 may use secret key data stored in the non-volatile memory 210 and/or measurements made by the measurement engine 216 to derive a secret key (e.g., derived secret key 218). The derived secret key 218 may be outputted to a register 220 that temporarily stores the value of the derived secret key 218 before outputting from the selection circuitry 116 (e.g., in response to selection output (SEL) 114). Storing a secret key in the non-volatile memory 210 may improve security since the secret key the derived secret key 218 is based on may be periodically updated per input to the non-voltage memory 210, similar to how a password for a user account may be periodically updated with a new password.

In some embodiments, referring briefly back to FIG. 2, the read data randomizer component 66 is included at the output from the memory array 18. As described earlier, the randomized read data may be output via the DQ path, or as depicted in FIG. 7, DQ path 68. In this way, monitoring of the output from the DQ path (e.g., such as wireless signal transmitted via the DQ path 68) may be leveraged to determine a geographical location of the memory device 14. This may be useful if the memory device 14 was stolen or otherwise accessed by an unauthorized user since the leaking random data may be tracked and leveraged to determine the unauthorized user, a location of the unauthorized user, or at least a location of the memory device 14 having been invalidly accessed.

As may be appreciated, although described as receiving or transmitting a particular number of bits using particular inputs, it should be understood that any suitable number of bits may be used to implement the techniques described herein. For example, circuitry depicted in FIG. 6 may be used to receive more or less than 3 bits via the address bus 36 and/or the secret key 42 may be more or less than 12 bits or 14 bits as described above. In a similar manner, any logic gate depicted may be replaced or included in addition to other logic circuitry to perform objectives described.

Accordingly, the technical effects of the present disclosure include techniques for using validation circuitry to protect sensitive data stored on a memory device. The techniques include systems and methods for performing bit-wise comparisons between an identifier transmitted by an SOC and a secret key stored on the memory device to determine whether a memory access request is authorized. These systems and methods permit selective control over refreshing operations of the memory device in response to the determination of whether the memory access request in authorized. As described above, in response to determining that a memory access request in unauthorized, the refreshing operations of the memory device are halted or modified such that inherent properties of DRAM memory may be leveraged to secure sensitive data. Furthermore, an authorized host device may refresh the verification circuitry to reset validation circuitry. Different variations are discussed above including examples that randomize the secret key, circuitry that arbitrates access to the memory array by a command decoder, an extended register to increase a number of bits used as an identifier to match a longer secret key, circuitry that randomizes read data to enable location tracing, among other features and benefits. These techniques may improve memory device technology by enabling low-cost security techniques that leverage just a few components to provide improved security techniques that respond faster by halting refreshing of the memory device (e.g., passive erasing) instead of actively erasing sensitive data of the memory device.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a command decoder configured to generate an auto-refresh signal to initiate a refresh of a memory array;
validation circuitry configured to verify that a memory access request transmitted to the command decoder is an authorized transaction, and generate a validation output indicating whether the memory access request is authorized;
logic circuitry configured to receive the auto-refresh signal from the command decoder and the validation output from the validation circuitry and arbitrate the initiation of the refresh of the memory array based at least in part on the validation output and the auto-refresh signal; and
counting circuitry configured to track a number of unauthorized memory access requests based at least in part on a plurality of validation outputs from the validation circuitry.

2. The device of claim 1, comprising a read data randomizer coupled to the logic circuitry and configured to randomize data read from the memory array in response to the validation output indicating the memory access request is unauthorized.

3. The device of claim 1, comprising a register configured to store a secret key.

4. The device of claim 3, wherein the secret key is used by the validation circuitry to determine whether the memory access request is authorized.

5. The device of claim 1, wherein the validation circuitry performs a bit-wise comparison between a first binary number and a second binary number to determine whether the memory access request is authorized.

6. The device of claim 5, wherein the first binary number comprises a smaller number of bits shifted in series through a plurality of flip-flops.

7. The device of claim 5, wherein the first binary number is configured to be output by system on a chip (SOC) in order to attempt to authorize its memory access request.

8. The device of claim 5, wherein the second binary number is configured based at least in part by a plurality of states of one or more fuses.

9. The device of claim 5, wherein the second binary number is configured based at least in part on a random number generator randomly setting a secret key each time the validation circuitry detects an unauthorized memory access request.

10. A device, comprising:
a command decoder configured to initiate a refreshing of a plurality of memory cells within a memory array;
validation circuitry configured to prevent the refreshing of the plurality of memory cells in response to detecting an invalid memory access request by a system on a chip (SOC);
a register comprising an identifier configured to be transmitted by the SOC; and
a security code calculator configured to output a secret key, wherein the validation circuitry is configured to compare the identifier to the secret key to detect the invalid memory access request, wherein the secret key is computed by the security code calculator based at least in part on a preset secret key known by one or more authorized systems on chips (SOCs) associated with the validation circuitry and unknown by the SOC.

11. A method, comprising:
receiving a secret key and an identifier;
detecting an invalid memory access request based at least in part on the secret key and the identifier; and
preventing unauthorized access of a memory array by halting an internal refresh of one or more memory cells associated with the memory array in response to detecting the invalid memory access request at least in part by transmitting one or more signals corresponding to the internal refresh through one or more logic gates responsive to an output generated in response to detecting the invalid memory access request.

12. The method of claim 11, wherein detecting the invalid memory access request comprises performing a bit-wise comparison via an exclusive-or (XOR) logic gate between the secret key and the identifier.

13. The method of claim 11, comprising:
receiving a first number of bits via an address bus;
increasing a duration of time of a transmission of the first number of bits to validation circuitry via an extended register; and
transmitting a second number of bits as the identifier after transmission through the extended register.

14. The method of claim 11, wherein the internal refresh is initiated in response to receiving a memory access request via a command bus, wherein the memory access request is determined not to be an authorized memory access request when received.

15. The method of claim 11, comprising:
randomizing a portion of data stored in the one or more memory cells of the memory array; and
initiating transmission of the randomized portion of data.

16. The method of claim 11, comprising modifying the secret key in response to a refresh signal received at a security code calculator.

17. A device, comprising:
- a command decoder configured to generate an auto-refresh signal to initiate a refresh of a memory array;
- validation circuitry configured to verify that a memory access request transmitted to the command decoder is an authorized transaction, wherein the validation circuitry is configured to generate a validation output indicating whether the memory access request is authorized, wherein the validation circuitry performs a bit-wise comparison between a first binary number and a second binary number to determine whether the memory access request is authorized, and wherein the second binary number is configured based at least in part by a plurality of states of one or more fuses; and
- logic circuitry configured to receive the auto-refresh signal from the command decoder and the validation output from the validation circuitry and arbitrate the initiation of the refresh of the memory array based at least in part on the validation output and the auto-refresh signal.

18. A method, comprising:
- receiving a secret key and an identifier;
- detecting an invalid memory access request based at least in part on the secret key and the identifier;
- preventing unauthorized access of a memory array by halting an internal refresh of one or more memory cells associated with the memory array in response to detecting the invalid memory access request;
- receiving a first number of bits via an address bus;
- increasing a duration of time of a transmission of the first number of bits to validation circuitry via an extended register; and
- transmitting a second number of bits as the identifier after transmission through the extended register.

* * * * *